United States Patent [19]

Schulz et al.

[11] Patent Number: 5,666,084
[45] Date of Patent: Sep. 9, 1997

[54] MULTI-LEVEL DEMODULATOR AND VCO CIRCUIT

[75] Inventors: Gary D. Schulz; Richard J. Keniuk, both of Cary, Ill.

[73] Assignee: Motorola, Inc., Schaumburg, Ill.

[21] Appl. No.: 566,239

[22] Filed: Dec. 1, 1995

[51] Int. Cl.⁶ .............................. H04L 27/38; H03L 7/087
[52] U.S. Cl. .......................... 329/307; 329/325; 331/11; 331/25; 375/327; 375/376
[58] Field of Search .................... 331/10, 11, 12, 331/25; 329/307, 308, 309, 325, 326; 375/327, 376; 455/260

[56] References Cited

U.S. PATENT DOCUMENTS

| | | |
|---|---|---|
| 4,365,211 | 12/1982 | Lee ............................................. 331/11 |
| 4,803,705 | 2/1989 | Gillingham et al. ........................ 331/11 |
| 4,807,252 | 2/1989 | Ikegami et al. ............................ 332/104 |
| 5,142,246 | 8/1992 | Petersson .................................. 331/11 |
| 5,157,355 | 10/1992 | Shikakura et al. ........................ 331/11 |
| 5,446,411 | 8/1995 | Horsfall et al. ............................ 329/325 |

*Primary Examiner*—Siegfried H. Grimm
*Attorney, Agent, or Firm*—Charles D. Gavrilovich, Jr.

[57] ABSTRACT

A multi-level demodulator has a VCO (32) and two reference frequency sources (50, 41). A relatively long time-constant loop (45, 47) has an input coupled to the VCO, an input coupled to one of the reference frequency sources (41) and an output coupled to the VCO. A relatively short time-constant loop (51, 30) has an input coupled to the VCO, an input coupled to the other reference frequency source (50) and an output coupled to the VCO.

10 Claims, 2 Drawing Sheets

5,666,084

MULTI-LEVEL DEMODULATOR AND VCO CIRCUIT

FIELD OF THE INVENTION

This invention relates to a multi-level demodulator and, separately and in addition, it relates to a voltage controlled oscillator (VCO) circuit.

BACKGROUND OF THE INVENTION

In the field of multi-level demodulators such as quadrature amplitude modulation (QAM) demodulators, it is known to provide a VCO circuit and a control loop to establish phase synchronization between the VCO and a received radio frequency carrier signal. This is advantageous for demodulation purposes.

A received signal is downmixed to a suitable intermediate frequency (I.F.) signal and is further downconverted to baseband by mixing with the VCO signal. For the result to be converted to digital form and to be demodulated into in-phase (I) and quadrature (Q) samples, locking of the VCO to the received carrier signal is necessary for coherent detection of M-ary quadrature amplitude modulated signals.

It is a disadvantage in existing circuits that phase or frequency comparators have a predefined range of operation. If the difference between the received signal and the reference signal is outside this range, the circuit is hopelessly unable to achieve lock. In the past it has been the practice always to ensure that the operation of the VCO is within the range of operation of the comparator. This has been achieved by presteering the VCO with trimmable resistors and capacitors which are settable in the factory to match the particular range of operation of the detector of the circuit and the particular VCO at its normal operating temperature.

By careful calibration, the circuit can be set such that on start-up the VCO always oscillates at a frequency which is offset from the wanted carrier frequency by no more than the predefined operating range of the detector. This is expensive in terms of technician time in performing the calibration and trimming the components.

Selecting a more accurate or higher stability VCO is not an option as this too involves expense or the accuracy and stability of the VCO may not be the limiting factor in the circuit.

Selecting a wider range of operation detector is not an option. For example in the case of a phase detector the maximum predefined range of operation is 360 degrees of the reference frequency signal. Selecting a wider range has an impact on the speed of locking or the stability of the loop.

The speed of operation of the loop is a significant design factor. A higher locking speed introduces greater instability while a lower locking speed can be unacceptable.

There is a need for an arrangement which avoids or mitigates some or all of the above deficiencies.

SUMMARY OF THE INVENTION

In accordance with a first embodiment of the invention, a multi-level demodulator is provided comprising a frequency adjustment loop having: a VCO; a first reference frequency source; and a relatively long time-constant loop having a first input coupled to the VCO and a second input coupled to the first reference frequency source and an output coupled to the VCO. The demodulator further comprises a second reference frequency source and a relatively short time-constant loop. The relatively short time-constant loop has first input coupled to the VCO and a second input coupled to the second reference frequency source and an output coupled to the VCO.

In this manner, the relatively long time-constant loop can control the VCO from a wide range of operation until the signal from the VCO falls within the range of operation of the relatively short time-constant loop.

In accordance with an alternative aspect of the invention a voltage controlled oscillator (VCO) circuit is provided comprising a VCO, and first and second adjustment loops. The first adjustment loop has: a first reference frequency source; a first phase/frequency comparator having a first input coupled to the output of the VCO, a second input coupled to the first reference frequency source and an output; and a relatively long time-constant filter coupled between the output of the first phase/frequency comparator and the input of the VCO. The second adjustment loop has: a second reference frequency source; a second phase/frequency comparator having a first input coupled to the output of the VCO, a second input coupled to the second reference frequency source and an output; and a relatively short time-constant loop filter coupled between the output of the first phase/frequency comparator and the input of the VCO.

These and other arrangements address the deficiencies of the prior art as can be understood from the following description Of certain preferred embodiments, which description is given by way of example only.

DETAILED DESCRIPTION OF THE DRAWINGS

Figure 1:
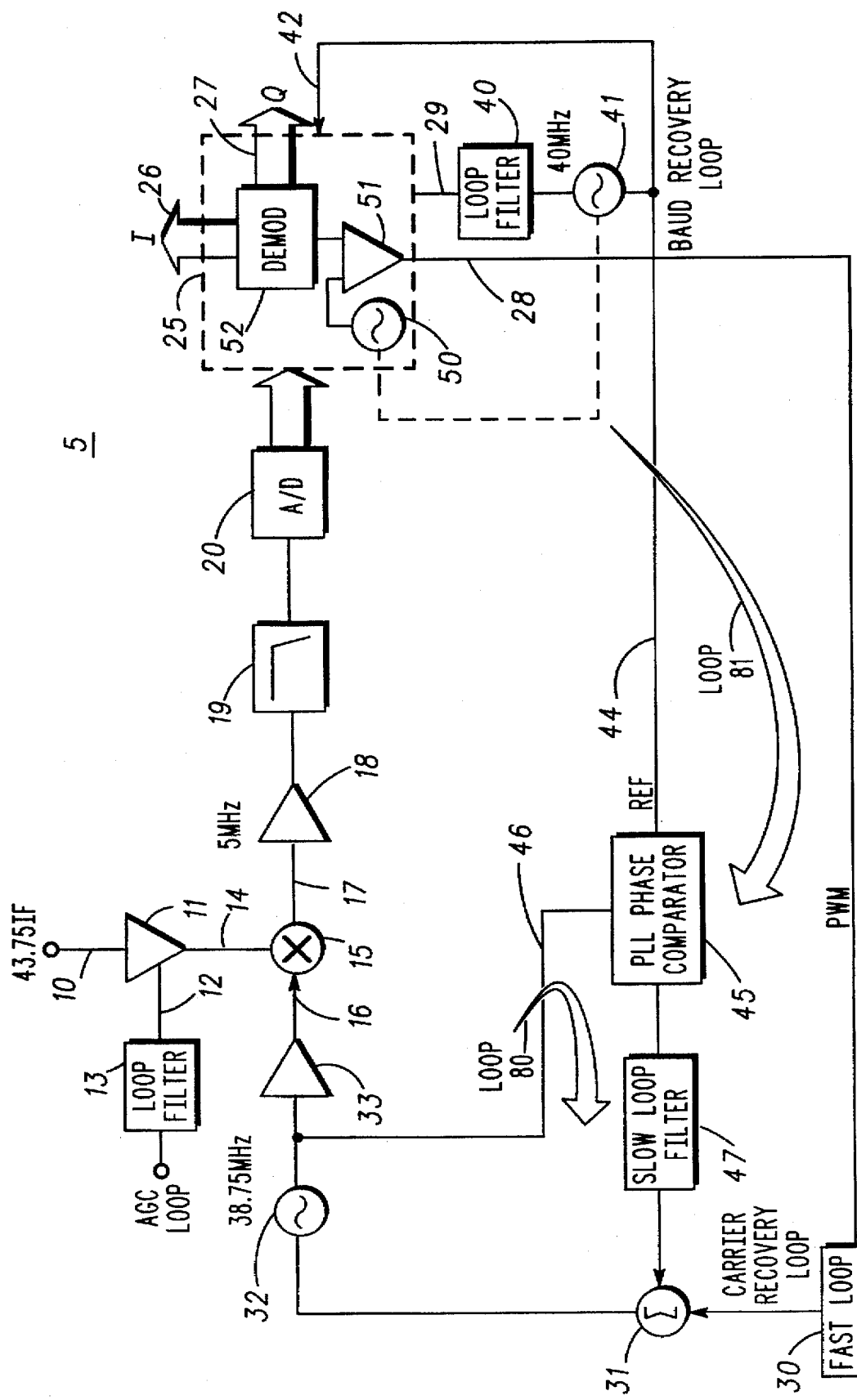
FIG. 1 is a circuit diagram of a demodulator circuit according to a first embodiment of the invention.

Referring to FIG. 1, a multi-level demodulator 5 is shown comprising an intermediate frequency (I.F.) input 10 connected to an amplifier 11. The amplifier 11 has a gain control input 12 to which an automatic gain control (AGC) loop filter 13 is connected. The details of the AGC loop of which the filter 13 forms a part need not be described here.

The amplifier 11 has an output coupled to one input 14 of a mixer 15. The mixer has a second input 16 and an output 17 connected to an amplifier 18, in turn connected to a low-pass filter 19 and an analog-to-digital (A/D) converter 20. The A/D converter 20 has a digital bus output to a digital I.F. receiver integrated circuit (I.C.) 25 which is, for example, a BCM3100 single-chip digital I.F. receiver available from Broadcom Corporation of 10920 Wilshire Boulevard, 14th floor, Los Angeles, Calif.

The receiver I.C. has in-phase (I) and quadrative (Q) outputs 26 and 27 respectively for outputting received symbols. It also has a pulse width modulated (PWM) carrier recovery loop output 28 and a baud recovery loop output 29.

The carrier recovery loop output 28 is connected to a loop filter 30 having a relatively short time-constant (therefore being relatively fast) which in turn is connected to a first input of a summer 31 and from there to a 38.75 MHz centered voltage controlled oscillator (VCO) 32. The VCO 32 has an output connected to the second input 16 of the mixer 15 via an amplifier 33.

The baud recovery loop output 29 of the I.C. 25 is connected to a loop filter 40 which is in turn connected to a second VCXO 41 (nominally 40 MHz) and has an output coupled to a baud recovery loop input 42 of the I.C. 25 and also coupled to a reference input 44 of a phase-lock-loop (P.L.L.) phase comparator 45 (otherwise referred to as a phase discriminator 45).

A second input 46 of the phase comparator 45 is connected to the output of the first VCO 32. The comparator 45 has an output connected to a loop filter 47 having a relatively long time-constant and therefore being relatively slow. The relatively slow loop filter 47 is connected to a second input of the summer 31.

Without it being necessary to describe the operation of integrated circuit 25 in detail, that circuit incorporates a reference frequency source 50 and a comparator 51 for frequency comparison which compares the frequency of the signal from the A/D converter 20 with the reference frequency source and provides an output to carrier recovery loop output 28 according to the comparison. The reference frequency source 50 has a relationship with the VCXO 41. The details of the relationship are not material (for example, it is not material whether the reference frequency source is derived from VCXO 41 or vice versa). It is a preferred (though not essential) feature that the reference frequency source generates a signal having a constant phase relationship with the signal of the output of VCXO 41. This can, for example, be achieved by deriving the reference frequency source from VCXO 41 via a divider. The integrated circuit 25 also has a demodulator circuit 52.

Comparator 51 is in effect a frequency discriminator 51 that provides, via loop filter 30, a frequency adjust signal to the VCO 32. Instead of comparator 51 being a frequency discriminator, a phase comparator can be used without departing from the scope of the invention.

The comparator 45 can be referred to as a first phase/frequency comparator 45 and has a relatively narrow range of phase operation. The comparator 51 can be referred to as a second phase/frequency comparator 51 and has a relatively wide range of phase operation. The loop filter 47 has a relatively long time-constant. The loop filter 30 has a relatively short time-constant.

The operation of the demodulator is as follows. A radio frequency signal QAM modulated with a 5M baud data signal is received and down-converted to I.F. at 43.75 MHz. This signal is received at the input 10. The I.F. signal is gain controlled in amplifier 11 and output to mixer 15 where it is further down-converted to 5 MHz. Note that it is advantageous for the recovered signal at output 17 to be at exactly the same frequency as the baud rate. This streamlines data recovery in the I.C. 25. The signal from the mixer 15 is amplified in amplifier 18, filtered in filter 19 and converted to digital form in A/D converter 20.

Receiver I.C. 25 performs a comparison in comparator 51 between the phase or frequency of the input signal from A/D converter 20 and the phase or frequency of its reference frequency source 50. This comparison results in a quantitative output (proportional to the magnitude of the difference) in the form of a PWM modulated output 28. This signal, after filtering (i.e. integrating) with a short time-constant in filter 30 causes VCO 32 to be "steered", but only if the difference between the reference frequency source and the input signal is within a predefined narrow range. Outside this narrow range, the output 28 "rails" at its maximum or minimum and the signal is not representative of the necessary direction in which VCO 32 is to be steered, so that the loop represented by VCO 32, I.C. 25 and filter 30 does not lock.

This situation is typical on power-on of the demodulator and in other situations (e.g. changing of frequency channels). In the past it has been necessary to add manual resistor/capacitor trimmers which are set in the factory after extensive calibrating so that the VCO 32 always operates within the limits of the detector of the I.C. 25. This has been time consuming and expensive.

In the circuit of FIG. 1, the P.L.L. comparator 45 acts in this situation as follows.

P.L.L. comparator 45 compares the output from the VCO 32 of input 46 with the signal from VCXO 41 on input 44 as a reference. P.L.L. comparator 45 includes appropriate divider circuits to bring the input signals to the same frequency for comparison. The result is an output which is filtered (integrated) with a long time-constant in filter 47. The output is summed with the output of filter 30 in summer 31. In the situation where output 28 from I.C. 25 is inoperative for loop locking, the summer 31 allows the output from slow filter 47 to steer the VCO 32. When the VCO 32 comes to within the predefined range of operation of the frequency or phase comparator in I.C. 25, output 28 begins to provide a meaningful output which is added in summer 31 to the output from filter 47 to further steer the VCO 32. Eventually, the output from filter 47 tends towards zero as the frequency of VCO 32 stabilizes and the signal from filter 30 is dominant in steering the VCO.

The first adjustment loop 80 formed by VCO 32, P.L.L. phase comparator 45 and slow filter 47 acts as a coarse steering loop and the second adjustment loop 81 formed by VCO 32, I.C. 25 and fast filter 30 acts as a fine steering loop.

Factory trimming of calibration resistors and capacitor is obviated.

Upon locking of the VCO 32 to the desired frequency, the input to the I.C. 25 is exactly equal to the baud rate (5.0 MHz) and the I.C. 25 can demodulate the signal into I and Q samples in a manner known in the art of QAM modulation.

Upon locking of the VCO 32, the baud recovery loop formed by I.C. 25, loop filter 40 and reference frequency source 41 takes over and the I.C. 25 steers the 40 MHz VCXO 41 to give zero error for the I.C. (e.g. 40.0001 MHz may be "perfect" for the particular I.C.). The loop formed by P.L.L. phase comparator 45, filter 47 and VCO 32 will react to steer VCO 32 to the new reference and now zero error will be achieved at the input to I.C. 25. This is an additional and unexpected advantage in the particular arrangement shown, as it allows for improved demodulation in I.C. 25. If, for example, the temperature changes, the I.C. 25 may have too narrow a range of frequency operation, but the new arrangement will always maintain a perfect input. This is achieved without the need for temperature sensors.

Figure 2:
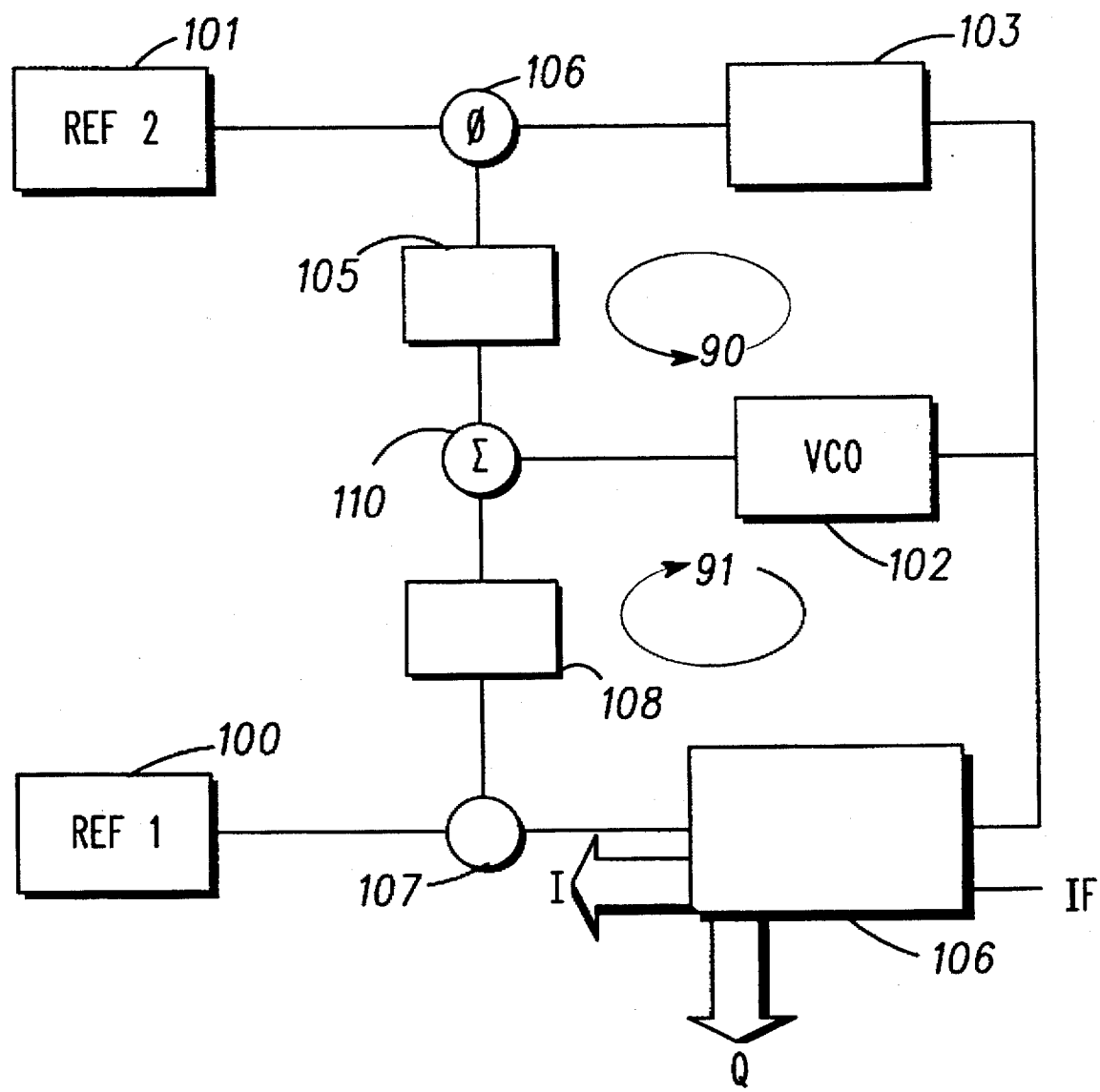
FIG. 2 is a circuit diagram of a demodulation circuit according to a second embodiment of the invention.

FIG. 2 shows an alternative embodiment of the invention which is a generalization of the circuit of FIG. 1. The circuit shown has first and second reference sources 100 and 101 which preferably have a constant phase relationship. A VCO 102 is provided which gives an output to a coarse and slow frequency adjustment loop 90 having a divider (or multiplier) 103, a phase comparator 104 and a slow loop filter 105 as well as to a fine and fast frequency adjustment loop 91 having a divider or multiplier encompassed in circuit 106, a fine (i.e. narrow predefined range) phase or frequency comparator 107 and a fast loop filter 108. The outputs from filters 105 and 108 are summed in summer 110 and the summation steers VCO 102.

It will be appreciated that frequency adjustment and phase adjustment are considered synonymous.

Other functions of the circuit (such as QAM demodulation) are encompassed in circuit 106 but could be implemented at other points in the overall circuit.

When loop 91 is out of lock, loop 90 steers the VCO 102 until the output from circuit 106 is within the narrow predefined range of comparator 107, whereupon the output from comparator 107 begins to steer the VCO 102 and eventually dominates in the control of the VCO when the frequency stabilizes.

The comparator 104 and loop filter 105 can together be considered to be a relatively long time-constant loop. The comparator 107 and loop filter 108 can together be considered to be a relatively short time-constant loop.

Different weighting factors can be applied to the two inputs to the summer 110, e.g. by giving the output from filter 108 greater weight.

Instead of summer 110, a two-way switch can be used to selectively switch the filter 105 or the filter 108 to the control input of the VCO 102. The switch can be controlled such that when the signals input to the comparator 107 are within the predefined range of operation of the comparator (e.g. in the case where the comparator is a phase comparator, the signals are less than 360 degrees apart), the switch would disconnect filter 105 and connect filter 108 to the input of VCO 102. Such switching would preferably avoid sudden transients at the input to the VCO, e.g. by implementing the switching when the output from the filter 108 is approximately equal to the output from the filter 105.

Alternatively a switch can be employed to deactivate loop 90 when loop 91 is in lock. Other software control arrangements can readily be devised to selectively allow loop 90 and loop 91 to control the VCO 102.

What is claimed is:

1. A multi-level demodulator comprising:

a demodulator circuit;

a relatively long time-constant phase or frequency adjustment loop having a voltage controlled oscillator (VCO), a first reference frequency source, and a phase or frequency comparator having a first input coupled to the VCO and a second input coupled to the first reference frequency source and an output coupled to the VCO;

a second reference frequency source; and a relatively short time-constant phase or frequency adjustment loop with a phase or frequency comparator having a first input coupled to the VCO via the demodulator circuit, a second input coupled to the second reference frequency source, and an output coupled to the VCO.

2. A multi-level demodulator according to claim 1, wherein the first and second reference frequency sources have a constant phase relationship.

3. A multi-level demodulator according to claim 1, wherein the phase or frequency comparator of the relatively long time-constant phase or frequency adjustment loop is a frequency comparator and provides a frequency adjust signal to the VCO.

4. A multi-level demodulator according to claim 1, wherein the phase or frequency comparator of the relatively short time-constant phase or frequency adjustment loop is a phase comparator and provides a phase adjust signal to the VCO.

5. A multi-level demodulator according to claim 1, wherein the phase or frequency comparator of the relatively long time-constant phase or frequency adjustment loop has a relatively narrow range of phase or frequency operation and the phase or frequency comparator of the relatively short time-constant phase or frequency adjustment loop has a relatively wide range of phase or frequency operation.

6. A multi-level demodulator comprising:

a demodulator circuit;

a relatively long time-constant phase or frequency adjustment loop having a voltage controlled oscillator (VCO), a first reference frequency source, and a phase or frequency comparator having a first input coupled to the VCO and a second input coupled to the first reference frequency source and an output coupled to the VCO;

a second reference frequency source;

an input for receiving a modulated intermediate frequency signal;

a mixer coupled to the input and to the VCO, the mixer having an output coupled to the demodulator circuit;

a relatively short time-constant phase or frequency adjustment loop with a phase or frequency comparator having a first input coupled to the mixer via the demodulator circuit, a second input coupled to the second reference frequency source, and an output coupled to the VCO;

the demodulator circuit having an output providing a recovered signal having a baud rate; and a baud recovery loop coupled to the output of the demodulator circuit, comprising a third frequency source for adjustment to the baud rate of the recovered signal.

7. A multi-level demodulator according to claim 6, wherein the first reference frequency source is derived from the third frequency source.

8. A multi-level demodulator according to claim 6 wherein the mixer provides a signal derived from the VCO and the intermediate frequency signal, which has a frequency equal to the baud rate.

9. A voltage controlled oscillator (VCO) circuit comprising:

a VCO having an input and an output;

a first adjustment loop having a first reference frequency source, a first phase or frequency comparator having a first input coupled to the output of the VCO, a second input coupled to the first reference frequency source and an output and a relatively long time-constant filter coupled between the output of the first phase or frequency comparator and the input of the VCO; and a second adjustment loop having a second reference frequency source, a second phase or frequency comparator having a first input coupled to the output of the VCO, a second input coupled to the second reference frequency source and an output, a relatively short time-constant filter coupled between the output of the second phase or frequency comparator and the input of the VCO; and a demodulator circuit coupled between the output of the VCO and the relatively short time-constant filter, having an output providing a recovered signal having a baud rate;

a baud recovery loop coupled to the output of the demodulator circuit comprising a third frequency source for adjustment to the baud rate of the recovered signal.

10. The voltage controlled oscillator circuit of claim 9 wherein the third frequency source is a second voltage controlled oscillator and the first reference source is derived from the third frequency source.

* * * * *